US006605521B2

(12) United States Patent
Ajmera et al.

(10) Patent No.: US 6,605,521 B2
(45) Date of Patent: Aug. 12, 2003

(54) METHOD OF FORMING AN OXIDE FILM ON A GATE SIDE WALL OF A GATE STRUCTURE

(75) Inventors: Atul C. Ajmera, Wappingers Falls, NY (US); Karanam Balasubramanyam, Hopewell Junction, NY (US); Tomio Katata, Yokohama (JP); Shang-Bin Ko, Poughkeepsie, NY (US)

(73) Assignees: Kabushiki Kaisha Toshiba, Kawasaki (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/265,729

(22) Filed: Oct. 8, 2002

(65) Prior Publication Data
US 2003/0036253 A1 Feb. 20, 2003

Related U.S. Application Data

(63) Continuation of application No. 09/066,976, filed on Apr. 28, 1998, now abandoned.

(51) Int. Cl.[7] .......................................... H01L 21/4763
(52) U.S. Cl. ....................................................... 438/595
(58) Field of Search ................................ 438/303, 584, 438/592, 595, 655, 778

(56) References Cited

U.S. PATENT DOCUMENTS

| 4,585,492 A | 4/1986 | Weinberg et al. ............. 148/1.5 |
| 4,833,099 A | 5/1989 | Woo ............................... 437/41 |
| 5,015,593 A | 5/1991 | Yawata et al. ................. 437/25 |
| 5,147,820 A | 9/1992 | Chittipeddi et al. ......... 437/200 |
| 5,183,771 A | 2/1993 | Mitsui et al. .................. 437/44 |
| 5,272,666 A | 12/1993 | Tsang et al. ................... 365/96 |
| 5,296,385 A | 3/1994 | Moslehi et al. ................ 437/20 |
| 5,296,411 A | 3/1994 | Gardner et al. .............. 437/238 |
| 5,356,837 A | 10/1994 | Geiss et al. .................. 437/200 |
| 5,376,592 A | 12/1994 | Hashiguchi et al. ........ 437/239 |
| 5,384,285 A | 1/1995 | Sitaram et al. .............. 437/200 |
| 5,393,685 A | 2/1995 | Yoo et al. ....................... 437/44 |
| 5,397,909 A | 3/1995 | Moslehi ....................... 257/383 |
| 5,468,687 A | 11/1995 | Carl et al. ................... 437/235 |
| 5,478,765 A | 12/1995 | Kwong et al. ................ 437/40 |
| 5,521,127 A | 5/1996 | Hori ........................... 437/238 |
| 5,550,082 A | 8/1996 | Wolfe et al. ................. 437/168 |
| 5,605,853 A | 2/1997 | Yoo et al. ....................... 437/43 |
| 6,177,334 B1 * | 1/2001 | Chen et al. ................. 438/584 |

FOREIGN PATENT DOCUMENTS

JP          10-256183      *  9/1998     .......... H01L/21/28

OTHER PUBLICATIONS

M.K. Mazumder et al. Improved reliability of NO Treated NH–3–nitrided Oxide with Regard to Osub2 annealing. Pergamon Press, pp. 921–924.

Serra et al. Modification of silicon nitride films to oxynitrides by ArF excimer laser irradiation. Elsevier press, pp. 211–215.

Benistant et al., Comparison of Ultra–thin Gate Dielctrics for 0.1 microm MOS Devices. Elsever press, pp. 105–108.

* cited by examiner

Primary Examiner—Carl Whitehead, Jr.
Assistant Examiner—David S Blum
(74) Attorney, Agent, or Firm—Banner & Witcoff, Ltd.

(57) ABSTRACT

In order to prevent abnormal oxidation of the side wall of a polycide gate conductor layer in the oxidation heat treatment process after the RIE processing of the polycide gate conductor layer in a semiconductor memory cell, the heat treatment for oxidizing the side wall of the polycide gate conductor layer is conducted in two steps with different conditions. By conducting the first heat treatment process in an inert atmosphere, a thin oxide film is formed on the side wall of the polycide tungsten/gate conductor layer. Then by conducting the second heat treatment process in an atmosphere with a strong oxidizing property, a thick oxide film without abnormal oxidation can be formed.

19 Claims, 10 Drawing Sheets

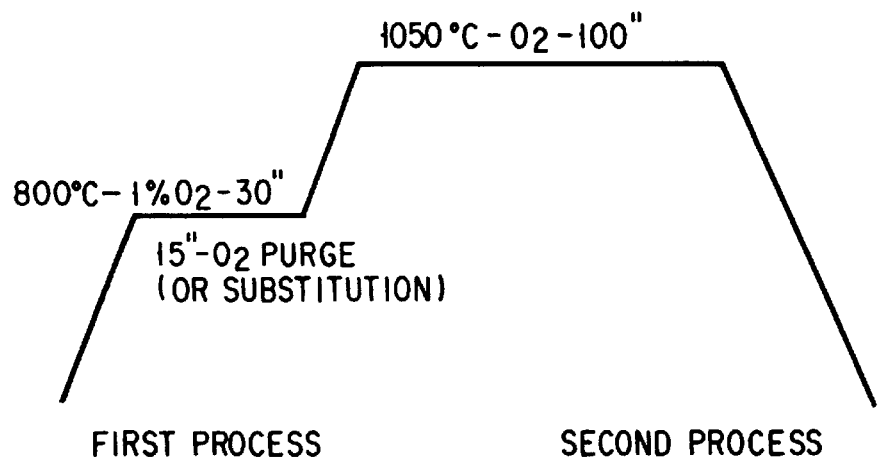

FIG. 9

PROCEDURE OF TWO STEP RTO IN THE SIDE WALL OXIDIZATION OF THE GATE CONDUCTOR LAYER

- P- <100> Si WAFER

- 256 DRAM PROCESS UPTO THE TRANSFER GATE OXDIZATION

- GATE STRUCTURE LAYER LAMINATION : N⁺ POLYSILICON / WSi / LPCVD-Si₃N₄ AND A MASK LAYER USED IN FORMING A GATE STRUCTURE

- FORMATION OF A MASK USED IN FORMING A GATE STRUCTURE/ ETCHING OF THE GATE STRUCTURE LAYER

- PRELIMINARY CLEANING OF GATE STRUCTURE

- TWO STEP RTO OF GATE STRUCTURE

- ANNEALING : 800°C -120"-N₂

- RTO : 1050°C -100"- O₂

FIG. 10

DATA OF THE RTO CONDITIONS AND THE OXIDE
FILM THICKNESS
$(800°C-120''-N_2 + 1050°C-XX''-O_2)$

| TEMPERATURE (°C) | TIME (SECOND) | FILM THICKNESS OF THE OXIDE FILM (ANGSTROM) |
|---|---|---|
| 1050 | 22 | 55 |
| 1050 | 65 | 75 |
| 1050 | 100 | 100 |
| 1100 | 40 | 100 |

XP : $BF_2$, 7E14 atoms/cm$^2$, 10KeV

XN : As, 6E14 atoms/cm$^2$, 25KeV

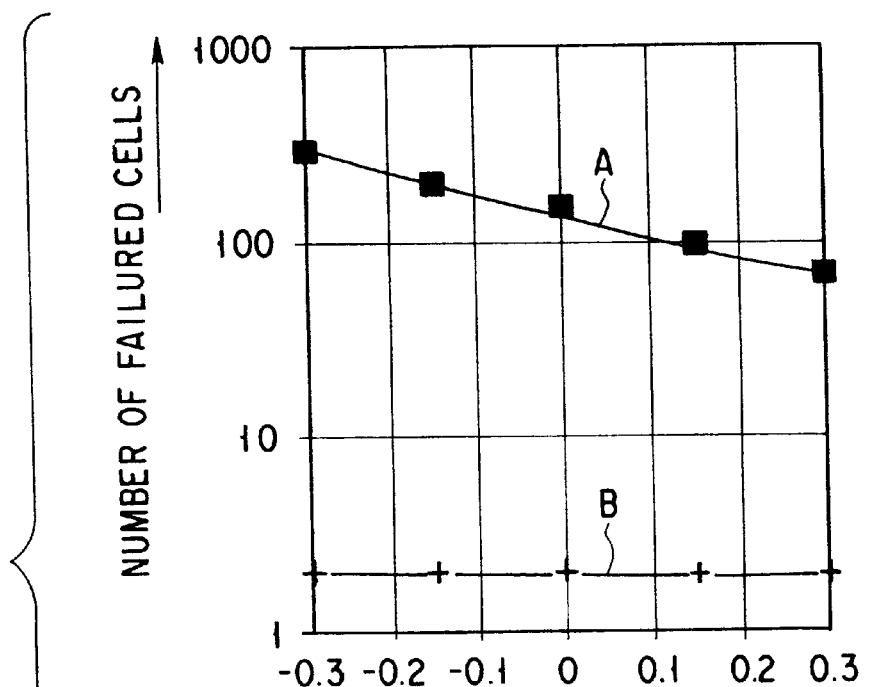
WORD LINE LOW LEVEL POTENTIAL (V)
A : SECOND PROCESS CONDITION 1050 °C -22"- O₂
(FILM THICKNESS OF THE OXIDE FILM : 55 ANGSTROM)
B : SECOND PROCESS CONDITION 1050 °C -100"- O₂
(FILM THICKNESS OF THE OXIDE FILM : 100 ANGSTROM)
A,B : FIRST PROCESS CONDITION 800°C - 120"- N₂
F I G. 14

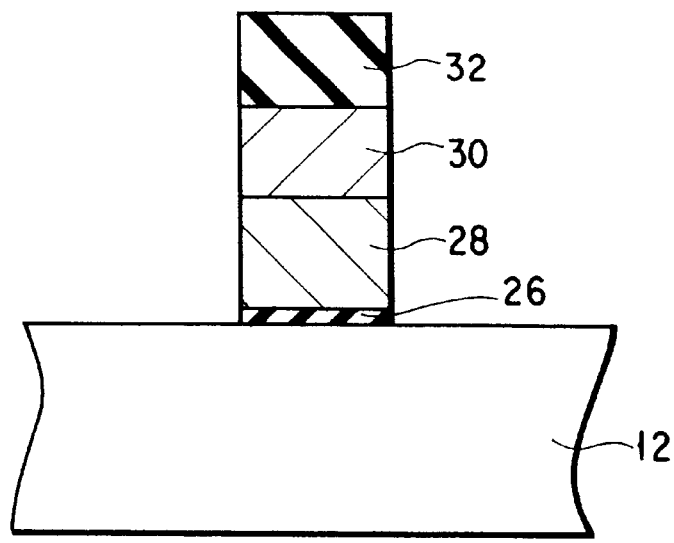
F I G. 15
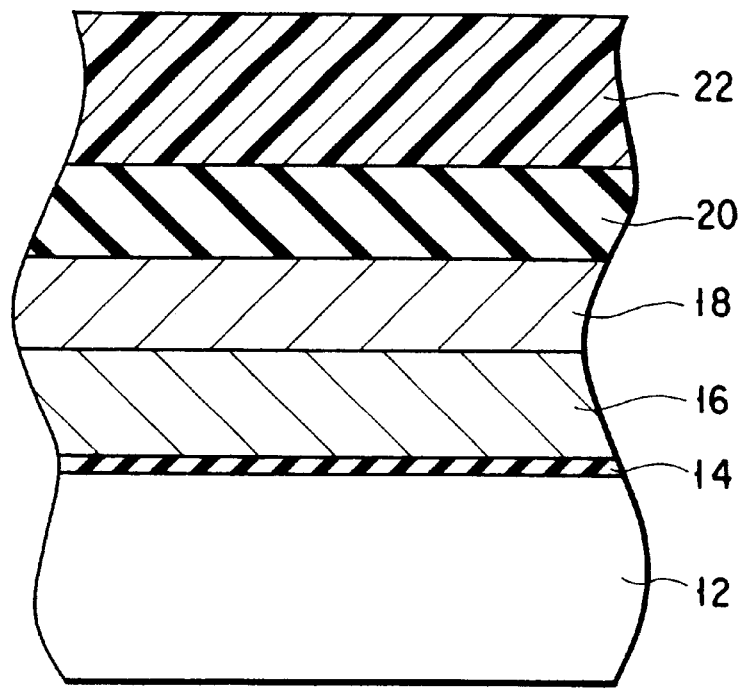
F I G. 16

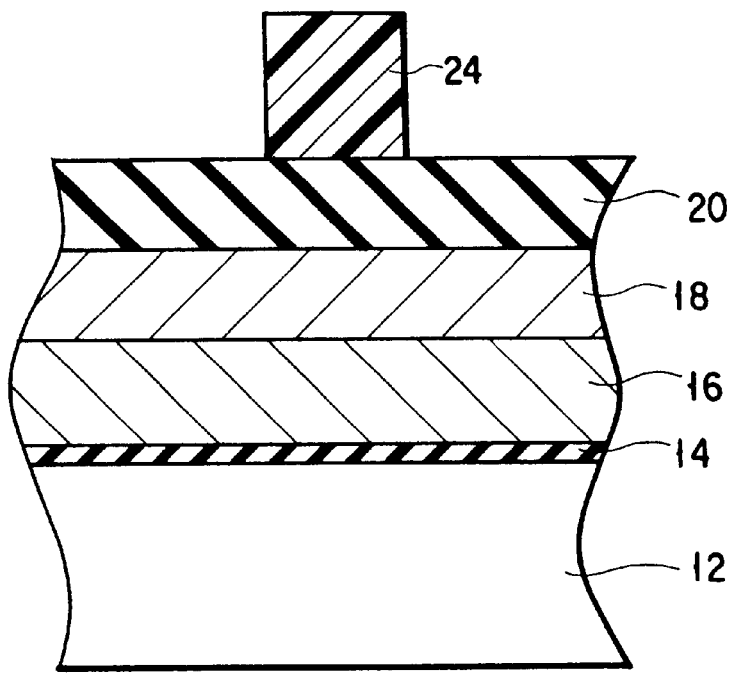
F I G. 17
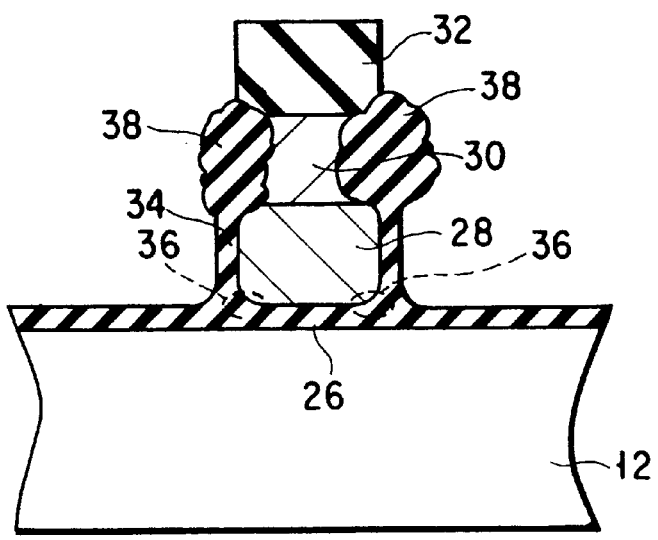
F I G. 18

METHOD OF FORMING AN OXIDE FILM ON A GATE SIDE WALL OF A GATE STRUCTURE

BACKGROUND OF THE INVENTION

The present invention relates to a method of forming an oxide film on a side wall of a gate structure, in particular, to a method for preventing abnormal oxidation of a side wall of a gate silicide layer in the post-etching oxidation treatment after forming a gate structure by an etching treatment.

In the field of semiconductor technology, a thinner and smaller element is being developed. For example, the latest DRAM cell has a gate insulating film of about 50 to 80 angstrom thickness and a metal silicide layer of about 500 to 1000 angstrom thickness. Furthermore, the width thereof is about 0.35 μm. The gate structure generally includes a thin $SiO_2$ gate insulating film (gate insulating film) 26, $N^+$ silicon gate conductor layer (gate conductor layer) 28, a tungsten silicide (WSi) layer (metal silicide layer) 30, and a silicon nitride (SiN) cap layer (cap layer) 32 successively laminated on a silicon semiconductor substrate 12 as shown in FIG. 15. The configuration including an $N^+$ silicon gate conductor layer 28 and a WSi layer 30 formed thereon is generally called a polycide (WSi/$N^+$ silicon) gate layer. Conventionally, in order to form the gate structure shown in FIG. 15, a thin $SiO_2$ film (insulating film) 14 is formed on a silicon semiconductor substrate by heat oxidation followed by an $N^+$ silicon conductor layer (conductor layer) 16 by the CVD method, a tungsten silicide (WSi) layer (metal silicide layer) 18 by the sputtering method, and a silicon nitride (SiN) layer (cap layer) 20 by the LPCVD (Low Pressure CVD) successively as shown in FIG. 16. Furthermore, a photo resist is applied on the laminated material layers to form a photo resist film 22 as shown in FIG. 16. Then by patterning the photo resist film, a resist pattern is formed as shown in FIG. 17. By patterning the laminated material layers by the RIE (reactive ion etching), using the resist pattern as the mask, the gate structure shown in FIG. 15 is formed. However, since the side wall of the $N^+$ silicon conductor layer and the WSi layer is exposed as well as the surface of the silicon semiconductor substrate is exposed by the etching treatment, the silicon substrate surface is contaminated due to the entrance of impurity into the silicon substrate surface or damaged due to the etching treatment. In order to realize a good gate structure, the damage needs to be eliminated. To this end, conventionally, the RTP (rapid thermal processing) is conducted in a substantially oxygen ($O_2$) 100% atmosphere as the post-etching oxidation treatment performed after the above-mentioned etching treatment so as to oxidize the exposed side wall of the $N^+$ silicon conductor layer and the WSi layer, and the exposed surface of the silicon semiconductor substrate. That is, by the post-etching oxidation heat treatment on the exposed side wall of the $N^+$ silicon conductor layer and the WSi layer, and the exposed surface of the silicon semiconductor substrate, an oxide film 34 is formed as shown in FIG. 18. By the post-etching oxidation heat treatment, the above-mentioned damage caused by the etching treatment at the time of forming the gate structure can be eliminated. At the same time, by the above-mentioned post-etching oxidation heat treatment, the electric field strength is weakened by the bird beak 36 generated at the lower part of the polysilicon layer rim portion as shown in FIG. 18 as well as the capacitance among the gate drains is reduced to shorten the access time.

However, in the above-mentioned conventional post-etching oxidation heat treatment, it is liable to generate abnormal oxidation 38. The abnormal oxidation can be easily generated particularly at the side wall oxidation of the WSi layer as shown in FIG. 18. That is, by the heat treatment in the oxygen atmosphere, WSi is decomposed to $WO_3$ and $SiO_2$. $WO_3$ is evaporated and the $SiO_2$ film is formed on the side wall of the WSi layer. At the time of the decomposition, Si is supplied from the $N^+$ silicon conductor layer to the WSi layer so as to contribute to the $SiO_2$ film formation. The heat treatment is conducted conventionally in the substantially oxygen 100% atmosphere, that is, in an atmosphere with a strong oxidizing property. However, if the heat treatment is conducted in the substantially oxygen 100% atmosphere, that is, in an atmosphere with a strong oxidizing property, the reaction proceeds rapidly so that the Si supply from the $N^+$ silicon conductor layer to the WSi layer becomes insufficient so that formation of a good $SiO_2$ layer is difficult. On the other hand, since a large amount of $WO_3$ is evaporated due to the rapid reaction, consequently the oxide film is made porous. It further accelerates the oxidation to result in the abnormal oxidation of the side wall of the WSi layer as shown in FIG. 18. The abnormal oxidation caused by the mechanism involves a serious problem particularly in the latest memory cell with a thin gate structure because the abnormal oxidation is more liable in a thinner film thickness and a smaller volume.

FIG. 19 is a cross-sectional SEM profile showing the state after the post-etching oxidation treatment of the WSi layer/polysilicon gate structure formed in the conventional method, and FIG. 20 is a perspective SEM profile thereof. The abnormal oxidation can be observed remarkably in FIGS. 19 and 20.

The above-mentioned problem of the abnormal oxidation on the side wall of the WSi layer (metal silicide layer) of the gate structure is more serious in, in particular, WSi layer with smaller size and thickness. Furthermore, with an oxide film bump formed due to the abnormal oxidation, which protrudes onto the side wall of the WSi layer, the contact resistance to the gate is increased and the controllability of the bit line contact is deteriorated.

BRIEF SUMMARY OF THE INVENTION

In order to solve the above-mentioned problems, an object of the present invention is to provide a method for preventing abnormal oxidation in the post-etching oxidation heat treatment for eliminating the damage caused on the exposed side wall of the gate conductor layer and the metal silicide layer, and the exposed surface of the silicon semiconductor substrate by the etching treatment conducted at the time of forming the gate structure of the semiconductor device, in particular, for preventing abnormal oxidation of the side wall of the metal silicide layer.

The present invention comprises two steps of rapid thermal processing (RTP) for the rapid thermal processing for the post-etching oxidation to be conducted after the etching treatment for eliminating the damage caused by the etching treatment conducted at the time of forming the gate structure of the semiconductor device. A first step of the RTP is a process of annealing for 120 seconds in an inert atmosphere of 700 to 1000° C., and a second step of the RTP is a process of annealing for 22 seconds in an oxygen atmosphere of 1000 to 1150° C. By the two step heat treatment, the damage caused in the gate structure and the semiconductor substrate at the time of the etching treatment can be eliminated. By the heat treatment in the inert atmosphere in first RTP process, a thin oxide film can be formed on the side wall of the metal silicide layer. Then by the heat treatment in an oxygen atmosphere of 1000 to 1150° C., the above-mentioned thin oxide film can be thickened to a sufficient film thickness. Since a thin but stable oxide film is already formed on the side wall of the metal silicide layer in the first RTP process at the time of conducting the second RTP process, the abnormal oxidation cannot be generated.

According to the invention, a method of forming an oxide film on a gate structure side wall, comprising the steps of successively forming an insulating film, a conductor layer, and a metal silicide layer on a semiconductor substrate, forming a gate structure including a gate insulating film, a gate conductor layer, and a gate silicide layer by etching the insulating film, the conductor layer, and the metal silicide layer, and forming an oxide film on the side wall of the gate structure by forming a thin oxide film on the side wall of the gate structure by the heat treatment of the gate structure with a first heat treatment condition followed by the heat treatment with a second heat treatment condition to thicken the thin oxide film, is provided. The first heat treatment condition may include an inert atmosphere and the second heat treatment condition may include an active atmosphere. The inert atmosphere in the first heat treatment condition may be a nitrogen ($N_2$) atmosphere, and the active atmosphere in the second heat treatment may be an oxygen ($O_2$) atmosphere. The inert atmosphere in the first heat treatment condition may be an argon (Ar) atmosphere, and the active atmosphere in the second heat treatment may be an oxygen ($O_2$) atmosphere. The first heat treatment condition may include a weak oxidizing atmosphere, and the second heat treatment condition may include a strong oxidizing atmosphere. The heat treatment process of the first heat treatment condition may be conducted with a first furnace, and the heat treatment process of the second heat treatment condition may be conducted with a second furnace independently from the first furnace. The heat treatment process of the first heat treatment condition and the heat treatment process of the second heat treatment condition may be conducted with a common furnace. A cleaning process may be further provided between the heat treatment process of the first heat treatment condition and the heat treatment process of the second heat treatment condition. The conductor layer may be a polysilicon layer. The metal silicide layer may be a tungsten silicide layer. The metal silicide layer may be a molybdenum silicide layer. The heating temperature in the first heat treatment condition may be 700 to 1000° C., and the heating temperature in the second heat treatment condition may be 1000 to 1150° C. The heating temperature in the first heat treatment condition may be 800° C., and the heating temperature in the second heat treatment condition may be 1050° C. The heating time in the first heat treatment condition may be 100 to 150 seconds and the heating time in the second heat treatment condition may be 20 to 120 seconds. The heating time in the first heat treatment condition may be 120 seconds and the heating time in the second heat treatment condition may be 65 seconds. The heating time in the first heat treatment condition may be 120 seconds and the heating time in the second heat treatment condition may be 100 seconds. The heating temperature in the first heat treatment condition may be 800° C., the heating temperature in the second heat treatment condition may be 1100° C., the heating time in the first heat treatment condition may be 120 seconds and the heating time in the second heat treatment condition may be 40 seconds.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a time diagram of a two step heat treatment method in one embodiment of a method for preventing abnormal oxidation of the side wall of a gate silicide layer of the present invention;

FIG. 10 shows a treatment procedure in one embodiment of a method for preventing abnormal oxidation of the side wall of the gate conductor layer of the present invention;

FIG. 14 is a graph showing the number of the destroyed cells with respect to the word line WL low level potential;

FIG. 15 is a cross-sectional view of a semiconductor structure in a process of a method for forming an oxide film on the side wall of a gate silicide layer of the conventional technology;

FIG. 16 is a cross-sectional view of a semiconductor structure in a process of a method for forming an oxide film on the side wall of a gate silicide layer of the conventional technology;

FIG. 17 is a cross-sectional view of a semiconductor structure in a process of a method for forming an oxide film on the side wall of a gate silicide layer of the conventional technology;

FIG. 18 is a cross-sectional view of a semiconductor structure in a process of a method for forming an oxide film on the side wall of a gate silicide layer of the conventional technology;

DETAILED DESCRIPTION OF THE INVENTION

Hereinafter embodiments of the present invention will be explained with reference to accompanied drawings.

In this embodiment, a method for preventing abnormal oxidation of the side wall of the metal silicide layer by adopting the RTP method including two steps as the post-etching oxidation heat treatment is disclosed.

Figure 1:
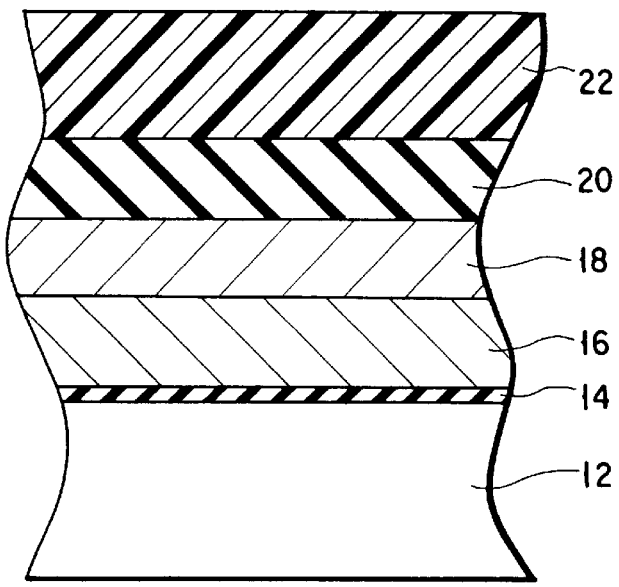
FIG. 1 is a cross-sectional view of a semiconductor structure in one embodiment of a process of a method for preventing abnormal oxidation of the side wall of a gate silicide gate layer of the present invention.

As shown in FIG. 1, a thin $SiO_2$ film (insulating film) of about 50 to 80 angstrom thickness 14 is formed on a silicon (Si) semiconductor substrate such as a P type silicon semiconductor substrate 12 of the crystal orientation of <100> by the heat oxidation, followed by an $N^+$ silicon layer (conductor layer) 16 by the CVD method, and a tungsten silicide (WSi) layer (metal silicide layer) 18 by the sputtering method. At the time, the WSi layer film is in the amorphous phase. Then an LPCVD (Low pressure CVD) SiN layer (cap layer) 20 is formed by the LPCVD method. Since the SiN formation temperature at the time is 780° C., the WSi layer film is crystallized to be tetragonal.

Figure 2:
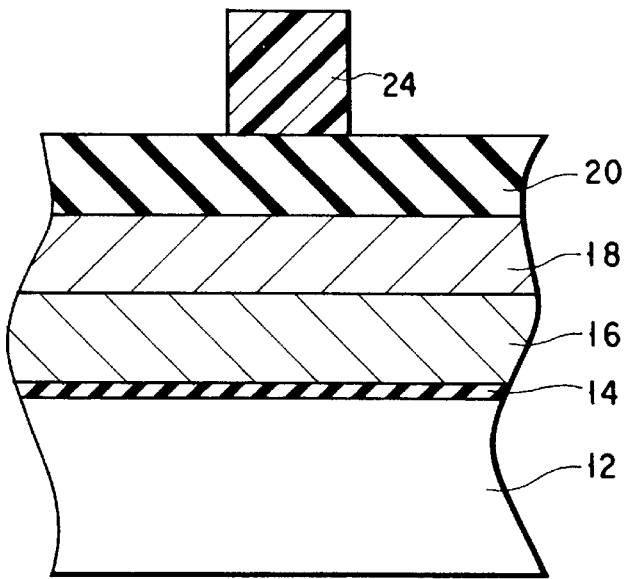
FIG. 2 is a cross-sectional view of a semiconductor structure in one embodiment of a process of a method for preventing abnormal oxidation of the side wall of a gate silicide gate layer of the present invention.

As shown in FIG. 1, a photo resist is applied on the entire surface of the semiconductor substrate of the above-mentioned configuration to form a photo resist film 22. The photo resist film 22 is patterned to form a resist pattern 24 shown in FIG. 2.

Figure 3:
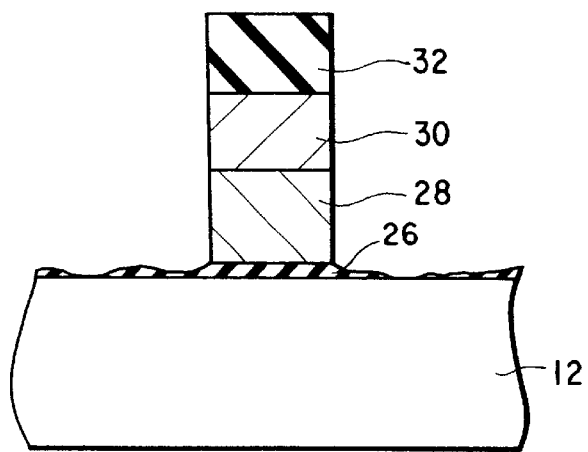
FIG. 3 is a cross-sectional view of a semiconductor structure in one embodiment of a process of a method for preventing abnormal oxidation of the side wall of a gate silicide gate layer of the present invention.

With the formed resist pattern 24 used as the mask, the $N^-$ silicon layer 16 doped with an N type impurity, the WSi layer 18, and the LPCVD-SIN layer 20 are applied with the RIE treatment, that is, the reactive ion etching treatment to form a gate structure shown in FIG. 3. At this time, the reactive ion etching is applied such that the $SiO_2$ film 14 may remain on the entire surface of the semiconductor substrate, however, in reality the etching treatment on the entire surface of the semiconductor substrate may be uneven to partially expose the semiconductor substrate. The gate structure comprises a gate $SiO_2$ film (gate insulating film) 26, the $N^+$ silicon gate layer (gate conductor layer) 28, the WSi layer (metal silicide layer) 30, and the SiN cap layer (cap layer) 32. The configuration including the $N^+$ silicon gate layer 28 and the WSi layer 30 formed thereon is generally called a polycide (WSi/$N^+$ silicon) gate layer. The gate $SiO_2$ film 26 can be, for example, a 256 MbDRAM transfer gate oxide film. By the above-mentioned etching treatment applied for forming the gate structure, damage is caused on the exposed side wall of the gate conductor layer and the metal silicide layer, and the exposed surface of the silicon semiconductor substrate.

Figure 4:
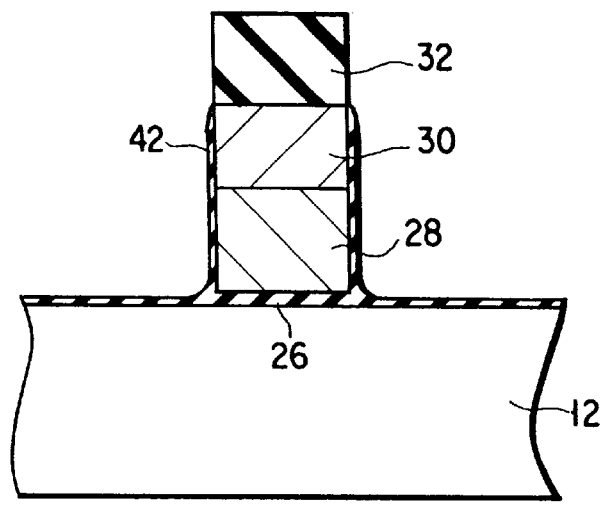
FIG. 4 is a cross-sectional view of a semiconductor structure in one embodiment of a process of a method for preventing abnormal oxidation of the side wall of a gate silicide gate layer of the present invention.
Figure 5:
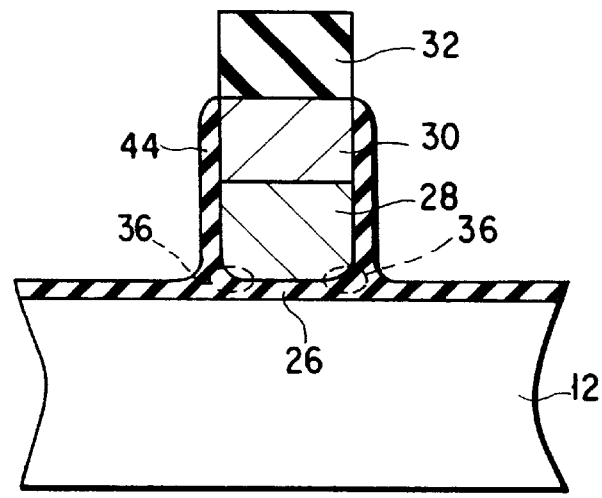
FIG. 5 is a cross-sectional view of a semiconductor structure in one embodiment of a process of a method for preventing abnormal oxidation of the side wall of a gate silicide gate layer of the present invention.

Then, in order to eliminate the damage, an oxide film is formed on the exposed side wall of the gate conductor layer and the metal silicide layer, and the exposed surface of the silicon semiconductor substrate. This oxidation is called post-etching oxidation. After the above-mentioned etching treatment for forming the gate structure, the rapid thermal processing (RTP) is conducted for forming an oxide film as the post-etching oxidation treatment. Thereby an oxide film is formed on the exposed side wall of the gate conductor layer and the metal silicide layer, and the exposed surface of the silicon semiconductor substrate. The post-oxidation heat treatment is conducted in two steps including a first step and a second step. A preliminary cleaning is conducted preceding the heat treatment, followed by the above-mentioned first and second steps of the post-etching oxidation treatment successively. Specifically, as shown in FIG. 4, annealing is conducted for 120 seconds in an inert gas atmosphere such as an $N_2$ gas atmosphere of 800° C. in the first heat treatment process, followed by annealing for 100 seconds in an $O_2$ gas atmosphere of 1050 to 1100° C. in the second heat treatment process. The $N_2$ gas inert atmosphere can be replaced by an argon (Ar) inert atmosphere. Furthermore, the annealing temperature in the first heat treatment process can be optionally selected from about 700 to 1000° C., and the annealing temperature in the second heat treatment process can be optionally selected from about 1000 to 1150° C. Moreover, the annealing time in the first heat treatment process and the annealing time in the second heat treatment process can be optionally selected respectively in relation with the annealing temperature. By the two step heat treatment, an oxide film with stable film thickness and quality can be formed on the exposed side wall of the gate conductor layer and the metal silicide layer, and the exposed surface of the silicon semiconductor substrate so that the above-mentioned damage caused at the time of forming the gate structure by the etching treatment can be eliminated. That is, by the first RTP process, a thin oxide film 42 is formed on the side wall of the metal silicide layer as shown in FIG. 4. Since the heat treatment is conducted in the $N_2$ atmosphere, that is, an inert atmosphere in the first RTP process, extreme oxidation cannot occur. Oxidation takes place only with an extremely small amount of oxygen ($O_2$) entered into the furnace from the outside atmosphere at the time of inserting the semiconductor substrate into a furnace. Therefore, since the oxidation speed is low and the WO3 can hardly be formed and the necessary Si amount to be supplied from the $N^+$ silicon gate layer is a little, the Si supply for the $SiO_2$ formation cannot be insufficient so that stable film thickness and quality can be realized without the risk of having the thin oxide film formed on the side wall of the metal silicide layer to be porous. By further applying a heat treatment in the oxygen atmosphere of 1000 to 1150° C. in the second RTP process, the film thickness of the above-mentioned oxide film can be sufficiently thickened to form a thick oxide film 44 as shown in FIG. 5. Since the heat treatment is conducted in a substantially 100% oxygen ($O_2$) atmosphere, that is, a highly oxidizing atmosphere in the second RTP process, strong oxidation occurs. However, since the thin but stable oxide film 42 is already formed on the side wall of the metal silicide layer in the first RTP process, the oxidation speed can be maintained appropriately, and the Si supply amount from the $N^+$ silicon gate layer to the WSi layer can be larger with respect to the Si consumption speed at the metal silicide side wall surface. Therefore the risk of abnormal oxidation can be prevented without $WO_3$ formation.

Figure 6:
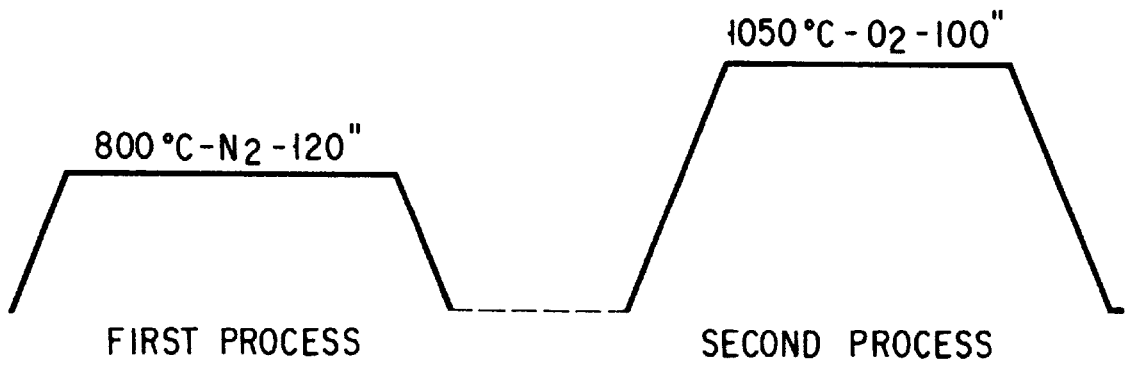
FIG. 6 is a time diagram of a two step heat treatment method in one embodiment of a method for preventing abnormal oxidation of the side wall of a gate silicide layer of the present invention.

FIG. 6 shows the above-mentioned embodiment in terms of the time diagram. The semiconductor substrate having the gate structure shown in FIG. 1 is inserted into the furnace for the first process, which is supplied with $N_2$ and heated to about 400° C. with a carrier arm. As shown in FIG. 6, the temperature is raised to 800° C. and the heat treatment is applied for 120 seconds. At the time of inserting the semiconductor substrate in to the furnace, an extremely small amount of oxygen ($O_2$) enters into the furnace from the outside atmosphere. By the small amount of oxygen ($O_2$), a thin oxide film 42 can be formed on the gate structure as shown in FIG. 4. Then the semiconductor substrate is taken out from the furnace for the first process, and is inserted into the furnace for the second process, which is supplied with an $O_2$ gas and heated to about 400° C., with a carrier arm as shown in FIG. 6. The temperature is raised to 1050° C. and the heat treatment is applied for 100 seconds. Thereby, the film thickness of the thin oxide film can be thickened sufficiently to form a thick oxide film 44 as shown in FIG. 5.

Figure 7:
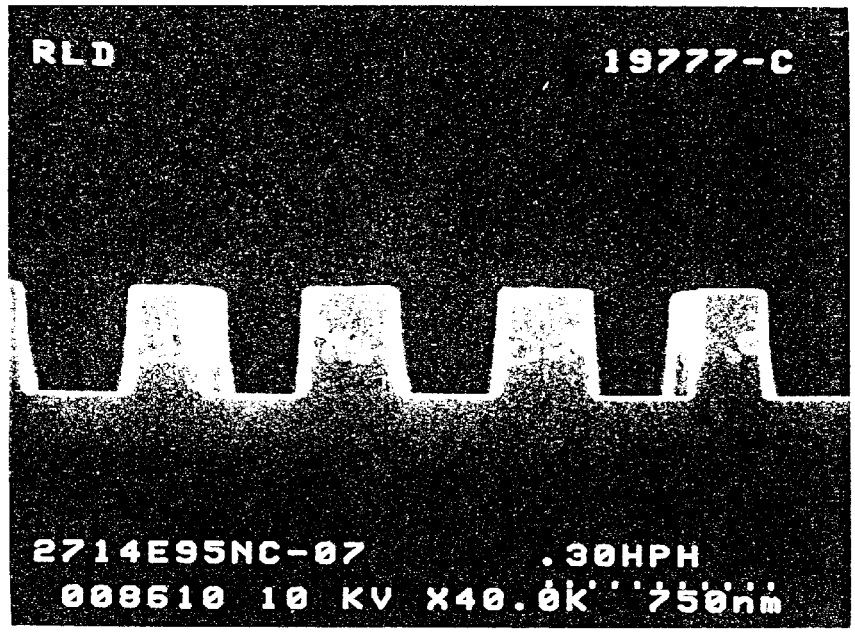
FIG. 7 is a cross-sectional SEM profile of the side wall oxide film obtained by the two step heat treatment method for preventing abnormal oxidation of the side wall of the gate silicide layer according to an embodiment of the present invention.
Figure 8:
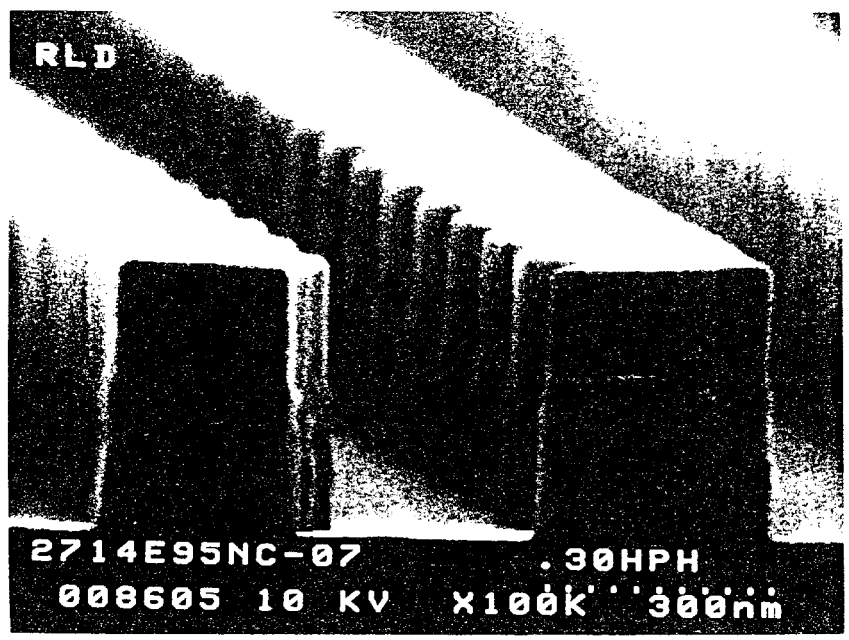
FIG. 8 is a perspective SEM profile of the side wall oxide film obtained by the two step heat treatment method for preventing abnormal oxidation of the side wall of the gate silicide layer according to an embodiment of the present invention.

FIG. 7 is a cross-sectional SEM profile of the gate structure formed by the above-mentioned embodiment, and FIG. 8 is a perspective SEM profile thereof. From FIGS. 7 and 8, it is observed that an oxide film with stable film thickness and quality is formed without causing the abnormal oxidation.

FIG. 9 shows a time diagram of the RTP process of another embodiment. This embodiment differs from the above-mentioned first embodiment in that one furnace is used for both first process and second process commonly without using a furnace for the first process and another furnace for the second process independently. The semiconductor substrate having the gate structure shown in FIG. 3 is inserted into a furnace heated to about 400° C. with a 1% oxygen ($O_2$) supplied thereto with a carrier arm. The temperature is raised to 800° C. and the heat treatment is applied for 30 seconds. By the weak oxidizing property of 1% oxygen, a thin oxide film can be formed as shown in FIG. 4. Then the 100% oxygen ($O_2$) is substituted by a gas in the furnace, and purged for 15 seconds. With the semiconductor substrate maintained in the furnace, the temperature of the furnace is raised to 1050° C. and applied with the heat treatment for 100 seconds. Thereby, the film thickness of the thin oxide film can be thickened sufficiently to form a thick oxide film 36 as shown in FIG. 5.

As heretofore mentioned, the post-etching oxidation heat treatment is conducted in two steps. That is, the first heat treatment process in an atmosphere with a low oxidizing property, which is not provided in the heat treatment of the conventional technology, preceding the second heat treatment process in an atmosphere with a high oxidizing property, which is the same process as the heat treatment process in the conventional technology. The first heat treatment process is a process with a treatment condition different from that of the second heat treatment process for forming a thin oxide film with stable film thickness and quality on the side wall of the metal silicide layer. Thereby, generation of abnormal oxidation by the heat treatment in the second RTP process can be prevented.

FIG. 10 shows the above-mentioned procedure of the two step heat treatment oxidation in a 256 MbDRAM process architecture. Although the procedure of FIG. 10 is provided as the case of applying the present invention to a 256 MbDRAM, the same can be applied to a 64 MbDRAM.

Figures 11, 12:
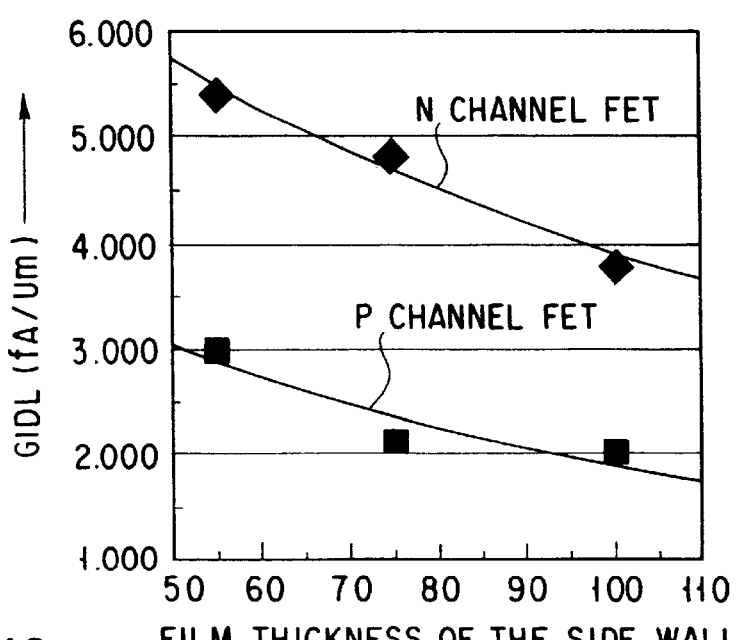
FIG. 11 is a table showing measured data of the RTP conditions and the oxide film thickness.
FIG. 12 is a graph showing characteristic curves of the film thickness of the side wall oxide film of the WSi layer and the leak current GIDL flowing in the gate.

FIG. 11 shows data of the film thickness of an oxide film with the first rapid thermal oxidation (RTO) process condition set to be 800° C., an $N_2$ atmosphere, and 120 seconds, and the second RTO process set to be 1050° C., an $O_2$ atmosphere, and time as a parameter. When the heating temperature set to be constant at 1050° C., the film thickness becomes thicker as the heating time becomes longer. With the heating time of 100 seconds, the film thickness is 100 angstrom. The thickness is the same as that of the film thickness (100 angstrom) with the heating temperature 100° C. and the heating time of 40 seconds. In FIG. 11, Xp denotes the implantation condition at the time of forming a P type diffusion layer. The condition is to inject $BF_2$ ions with the dose amount of 7E14 atoms/$cm^2$, and the accelerating voltage of 10 KeV. XN denotes the implantation condition at the time of forming an N type diffusion layer. The condition is to inject As ions with the dose amount of 6E14 atoms/$cm^2$, and the accelerating voltage of 25 KeV. The leak current GIDL (gate induced drain leak) becomes lower as the post-etching oxidation film thickness becomes thicker.

FIG. 12 shows the correlation between the film thickness of the side wall oxide film of the WSi layer and the leak current GIDL (gate induced drain leak) flowing in the gate. As apparent from FIG. 12, the leak current GIDL decreased smoothly as the film thickness of the oxide film becomes thicker in both N channel type MOSFET and P channel type MOSFET.

Figure 13:
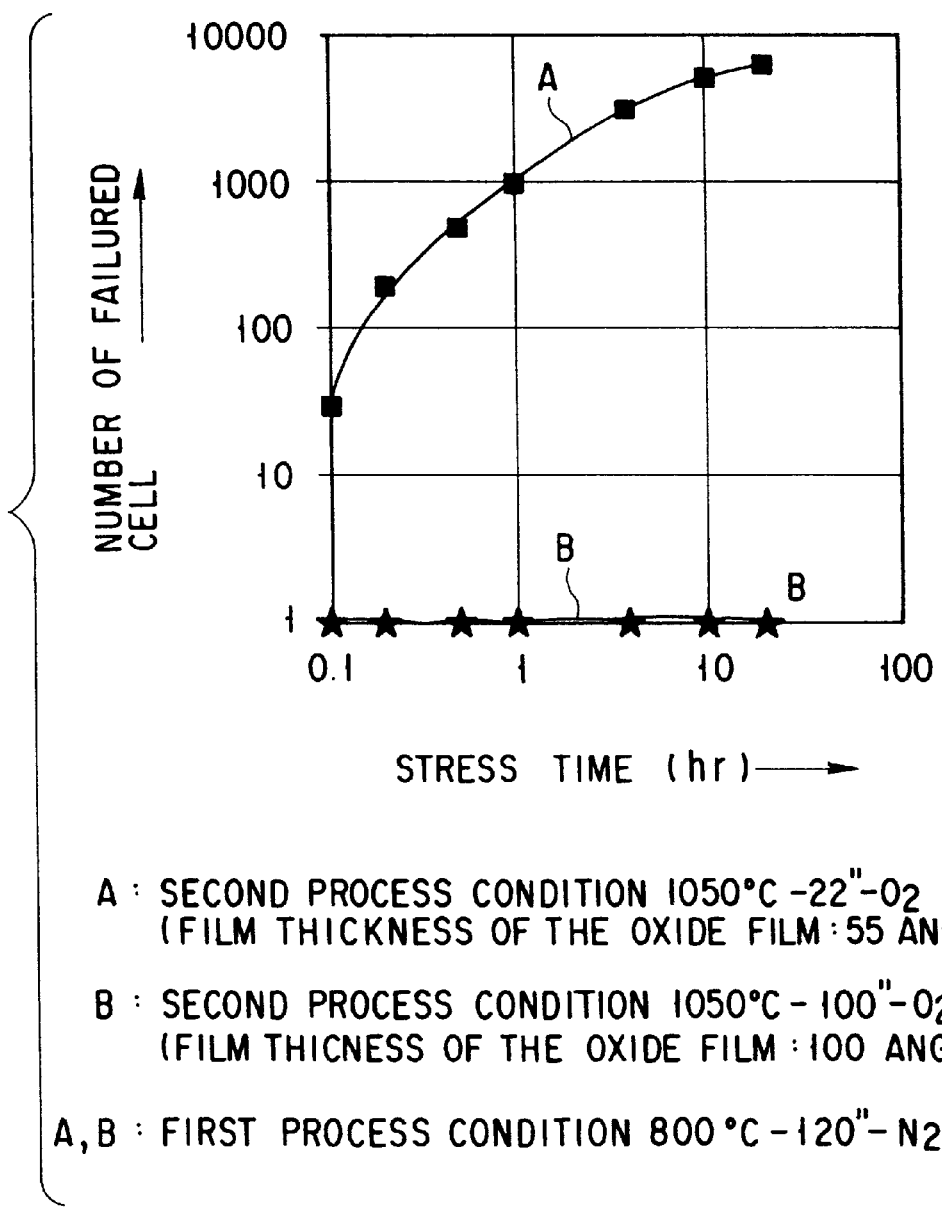
FIG. 13 is a graph showing the number of the malfunction cells (single cell fail) with respect to the voltage stress time.
Figure 19:
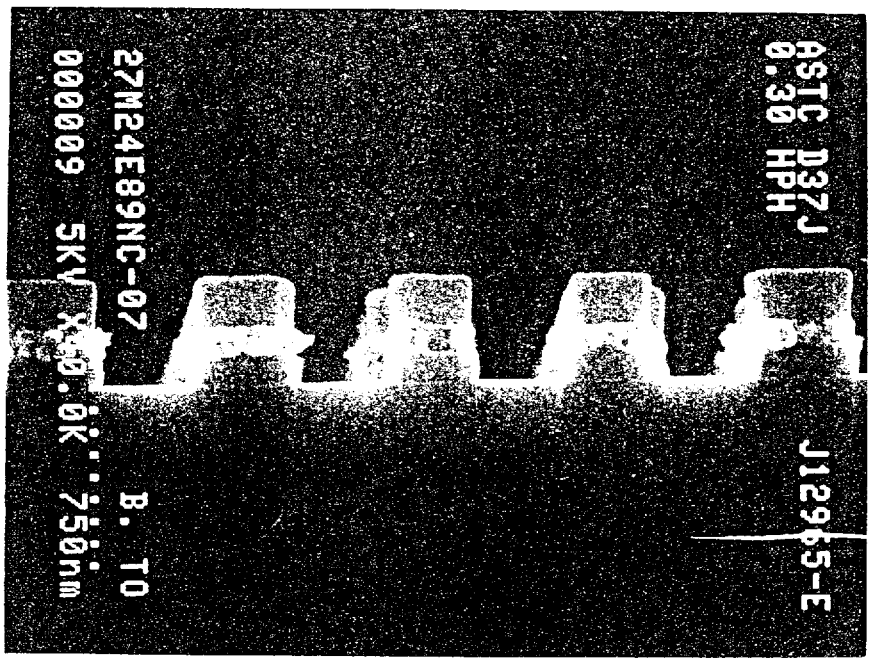
FIG. 19 is a cross-sectional SEM profile of the side wall oxide film obtained on the side wall of the gate silicide layer by the conventional heat treatment method.
Figure 20:
FIG. 20 is a perspective SEM profile of the side wall oxide film obtained on the side wall of the gate silicide layer by the conventional heat treatment method.

FIG. 13 shows the number of the failed cells (single cell fail) with respect to the voltage stress time. The failure of cells is judged by determining the residual charge amount of each cell in every 512 msec after applying voltage stress a predetermined time by whether or not the residual charge amount is more than a threshold for defining the failure. By counting the number of failed cells after applying a voltage stress for 20 hours, it was learned that the number of failed cells is remarkably reduced with the heating temperature of 1050° C. and the heating time of 100 seconds in the second RTP process.

FIG. 14 shows the number of the failed cells with respect to a low level potential of the word line WL. It was learned that the number of failed cells is drastically reduced with the heating temperature of 1050° C. and the heating time of 100 seconds in the second RTP process.

Since a thin but stable oxide film is formed on the side wall of the metal silicide layer at a low oxidation speed in the first process of the two step post oxidation heat treatment, an oxide film with a desired thickness can be formed on the side wall of the metal silicide layer without abnormal oxidation in the second process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of forming an oxide film on a gate structure side wall, comprising the steps of:

successively forming an insulating film, a conductor layer, and a metal silicide layer on a semiconductor substrate, forming a gate structure including a gate insulating film, a gate conductor layer, and a gate silicide layer by etching the conductor layer and the metal silicide layer;

placing said substrate in a rapid thermal processing furnace; and, forming an oxide film on the side wall of the gate structure, using a rapid thermal processing technology, by forming a thin oxide film on the side wall of the gate structure by the heat treatment of the entire substrate of the gate structure with a first heat treatment condition followed by the heat treatment of the entire substrate with a second heat treatment condition to thicken the thin oxide film, wherein the first heat treatment condition is a low-temperature annealing process and the second heat treatment is a high-temperature annealing process, and wherein the first heat treatment condition includes an inert atmosphere containing oxygen and the second heat treatment condition includes an active atmosphere.

2. The method of forming an oxide film on a gate structure side wall according to claim 1, wherein the inert portion of the atmosphere in the first heat treatment condition is a nitrogen ($N_2$) atmosphere, and the active atmosphere in the second heat treatment is an oxygen ($O_2$) atmosphere.

3. The method of forming an oxide film on a gate structure side wall according to claim 1, wherein the inert portion of the atmosphere in the first heat treatment condition is an argon (Ar) atmosphere, and the active atmosphere in the second heat treatment is an oxygen ($O_2$) atmosphere.

4. The method of forming an oxide film on a gate structure side wall according to claim 1, wherein the first heat treatment condition includes a weak oxidizing atmosphere, and the second heat treatment condition includes a strong oxidizing atmosphere.

5. The method of forming an oxide film on a gate structure side wall according to claim 1, wherein the heat treatment process of the first heat treatment condition is conducted with a first furnace, and the heat treatment process of the second heat treatment condition is conducted with a second furnace independently from the first furnace.

6. The method of forming an oxide film on a gate structure side wall according to claim 1, wherein the heat treatment process of the first heat treatment condition and the heat treatment process of the second heat treatment condition are conducted with a common furnace.

7. The method of forming an oxide film on a gate structure side wall according to claim 1, further comprising a cleaning process between the heat treatment process of the first heat treatment condition and the heat treatment process of the second heat treatment condition.

8. The method of forming an oxide film on a gate structure side wall according to claim 1, wherein the conductor layer is a polysilicon layer.

9. The method of forming an oxide film on a gate structure side wall according to claim 1, wherein the metal silicide layer is a tungsten silicide layer.

10. The method of forming an oxide film on a gate structure side wall according to claim 1, wherein the metal silicide layer is a molybdenum silicide layer.

11. The method of forming an oxide film on a gate structure side wall according to claim 1, wherein the heating temperature in the first heat treatment condition is 700 to 1000° C., and the heating temperature in the second heat treatment condition is 1000 to 1150° C.

12. The method of forming an oxide film on a gate structure side wall according to claim 1, wherein the heating temperature in the first heat treatment condition is 800° C., and the heating temperature in the second heat treatment condition is 1050° C.

13. The method of forming an oxide film on a gate structure side wall according to claim 1, wherein the heating time in the first heat treatment condition is 100 to 150 seconds and the heating time in the second heat treatment condition is 20 to 120 seconds.

14. The method of forming an oxide film on a gate structure side wall according to claim 13, wherein the heating time in the first heat treatment condition is 120 seconds and the heating time in the second heat treatment condition is 65 seconds.

15. The method of forming an oxide film on a gate structure side wall according to claim 13, wherein the heating time in the first heat treatment condition is 120 seconds and the heating time in the second heat treatment condition is 100 seconds.

16. The method of forming an oxide film on a gate structure side wall according to claim 13, wherein the heating temperature in the first heat treatment condition is 800° C., and the heating temperature in the second heat treatment condition is 1100° C.

17. The method of forming an oxide film on a gate structure side wall according to claim 16, wherein the heating time in the first heat treatment condition is 120 seconds and the heating time in the second heat treatment condition is 40 seconds.

18. A method of forming an oxide film on a gate structure side wall, comprising the steps of:

successively forming an insulating film, a conductor layer, and a metal silicide layer on a semiconductor substrate, forming a gate structure including a gate insulating film, a gate conductor layer, and a gate silicide layer by etching the conductor layer and the metal silicide layer;

placing said substrate in a rapid thermal processing furnace; and forming an oxide film on the side wall of the gate structure, using a rapid thermal processing technology, by forming a thin oxide film on the side wall of the gate structure by the heat treatment of the entire substrate including the gate structure with a first heat treatment condition followed by the heat treatment of the entire substrate with a second heat treatment condition to thicken the thin oxide film, wherein the first heat treatment condition is a low-temperature annealing process and the second heat treatment is a high-temperature annealing process, and wherein the first heat treatment condition includes an inert atmosphere containing oxygen and the second heat treatment condition includes an active atmosphere and wherein the thin oxide film is not formed prior to the first heat treatment.

19. A method of forming an oxide film on a gate structure side wall, comprising the steps of:

successively forming an insulating film, a conductor layer, and a metal silicide layer on a semiconductor substrate, forming a gate structure including a gate insulating film, a gate conductor layer, and a gate silicide layer by etching the conductor layer and the metal silicide layer;

placing said substrate in a rapid thermal processing furnace; and forming an oxide film on the side wall of the gate structure, using a rapid thermal processing technology, by forming a thin oxide film on the side wall of the gate structure by the heat treatment of the entire substrate including the gate structure with a first heat treatment condition followed by the heat treatment of the entire substrate with a second heat treatment condition to thicken the thin oxide film, wherein the first heat treatment condition is a low-temperature annealing process and the second heat treatment is a high-temperature annealing process, and wherein the first heat treatment condition includes an inert atmosphere containing nitrogen and the second heat treatment condition includes an active atmosphere containing oxygen.

* * * * *

UNITED STATES PATENT AND TRADEMARK OFFICE
CERTIFICATE OF CORRECTION

PATENT NO. : 6,605,521 B2  Page 1 of 1
DATED : August 12, 2003
INVENTOR(S) : Atul C. Ajmera et al.

It is certified that error appears in the above-identified patent and that said Letters Patent is hereby corrected as shown below:

<u>Title page,</u>
Item [57], ABSTRACT,
Line 9, "tungsten/gate" has been replaced with -- tungsten gate --.

<u>Column 10,</u>
Line 52, "wail" has been replaced with -- wall --.

Signed and Sealed this

Twenty-seventh Day of January, 2004

JON W. DUDAS
*Acting Director of the United States Patent and Trademark Office*